United States Patent [19]

Hupe et al.

[11] Patent Number: 6,007,866
[45] Date of Patent: Dec. 28, 1999

[54] PROCESS AND DEVICE FOR PRODUCING THROUGH-CONNECTED PRINTED CIRCUIT BOARDS AND MULTILAYERED PRINTED CIRCUIT BOARDS

[75] Inventors: Jürgen Hupe, Langenfeld; Sabine Fix, Wülfrath, both of Germany

[73] Assignee: Blasberg Oberflachentechnik GmbH, Solingen, Germany

[21] Appl. No.: 09/000,473

[22] PCT Filed: Jul. 17, 1996

[86] PCT No.: PCT/EP96/03134

§ 371 Date: Mar. 13, 1998

§ 102(e) Date: Mar. 13, 1998

[87] PCT Pub. No.: WO97/05758

PCT Pub. Date: Feb. 13, 1997

[30] Foreign Application Priority Data

Jul. 25, 1995 [DE] Germany .......................... 195 27 056

[51] Int. Cl.$^6$ ...................................................... B05D 5/10
[52] U.S. Cl. .......................... 427/96; 427/301; 427/304; 427/305; 427/306; 427/98
[58] Field of Search ..................... 205/125, 126; 427/96, 98, 301, 306, 307, 304, 305, 437, 443.1

[56] References Cited

U.S. PATENT DOCUMENTS 4,315,045   2/1982   Dillard et al. ........................... 427/307
5,373,629  12/1994   Hupe et al. ............................. 29/852
5,403,467   4/1995   Jonas et al. ............................. 205/125

*Primary Examiner*—Brian K. Talbot
*Attorney, Agent, or Firm*—Jacobson, Price, Holman & Stern, PLLC

[57] ABSTRACT

The process for producing through-connected printed circuit boards or multilayered printed circuit boards with a polymer base with conductive polymers using a combined desmearing and direct metalization process (multilayering) is performed by subjecting the polymer base materials, provided with bore holes, to the following process steps:

1) swelling in a per se known treatment liquid and rinsing with water;

2) treatment with alkaline permanganate solution (desmearing);

3) rinsing with water;

4) rinsing with acidic aqueous solution (pH value about 1, rinsing time 10 to 120 s, depending on acid content);

5) rinsing with water;

6) rinsing with alkaline aqueous solution (pH 8 to 9.5);

7) rinsing with water;

8) rinsing with microemulsion of ethylene-3,4-dioxythiophene (catalyst);

9) rinsing with acid (fixation);

10) rinsing with water;

11) coppering;

12) rinsing with water; and 13) drying;

14) usual process steps for creating the printed circuit pattern.

5 Claims, No Drawings

PROCESS AND DEVICE FOR PRODUCING THROUGH-CONNECTED PRINTED CIRCUIT BOARDS AND MULTILAYERED PRINTED CIRCUIT BOARDS

This application is a 371 of PCT/EP96/03134, filed Jul. 17, 1996, now WO 97/05758.

The present invention relates to a process for producing through-connected printed circuit boards or multilayered printed circuit boards with a polymer base with conductive polymers using a combined desmearing and direct metalization process (multilayering) wherein the polymer base materials, provided with bore holes, are subjected to a number of process steps.

Multilayered circuits must be chemically cleaned after the boring process in order to remove the so-called smear (resin smears which are formed on the copper inner layers in the boring process) from the inner layers. This is necessary in order to ensure proper binding of the copper layer of the later through-connecting process to the inner layer.

The cleaning process is also called "desmearing" and is usually performed in an alkaline permanganate solution which removes the smear oxidatively after preliminary swelling of the resin with solvents.

The "desmearing" is followed by the through-connecting process in the course of which the bore hole walls are metalized with copper.

This metalization is performed either by chemical deposition of copper or by direct metalization.

A wide variety of such direct metalization processes has been decribed. Thus, there are processes in which the activation of the non-conducting bore hole wall is effected by means of Pd nucleation, or else by deposition of carbon particles.

The patent specification DE 38 06 884 describes a direct metalization process which includes a step of treatment in permanganate for producing a conductive polymer film on the bore hole wall.

Accordingly, it should be possible, in principle, to combine the bore hole cleaning and through-connecting processes by using the same permanganate bath for both steps. In addition, since the manganese dioxide formed on the resin in the permanganate attack functions as an oxidant in polymer formation in the direct metalization process, the removal of manganese dioxide in the desmearing process (generally with $H_2SO_4/H_2O_2$), which is otherwise necessary, can even be dispensed with.

These process flows can be described by the following process steps:

I. Desmearing process
 a) swelling
 b) rinsing
 c) alkaline permanganate
 d) rinsing
 e) removing of manganese dioxide depositions
 f) rinsing
 g) drying
II. Direct metalization by means of a conductive polymer
 a) initial etching
 b) rinsing
 c) conditioning
 d) permanganate
 e) rinsing
 f) catalysing with organic monomer
 g) fixation (with acid) formation of the conductive polymer film
 h) rinsing
 i) coppering
 j) rinsing
 k) drying.

This idea is already contemplated in DE-A-39 31 003 and results in a simplified process flow.

However, the practical application of such simplified systems showed that considerable difficulties arise when an alkaline permanganate bath is used for desmearing with through-connecting. These are mainly due to the fact that the dwelling times in a commercially available desmearing permanganate are about 10 to 20 min, or about 1 to 2.5 min in a process with horizontal flow. The exposing times in permanganate which serves for the formation of a conductive polymer film are known from previous experience to be about 2 to 4 min or 30 to 60 s in horizontal flow. For a sufficient desmearing effect (cleaning) to be achieved, the above mentioned times cannot be further reduced.

Further, it has to be considered that the permanganate solution for the formation of the polymer film is generally employed in a pH range of from 5 to 9.

If the process is conducted as described in DE-A-39 31 003, through-connecting defects, such as defective copper covering of the resin and preferably glass, of the base material, are unavoidable, resulting in a total failure of the printed circuit board thus produced.

Being aware of these experiences, DE-A-40 40 226 proposes a process flow which contains two permanganate steps in sequence in order to solve the above mentioned problems. Indeed, it is possible to produce high quality printed circuit boards with this process flow.

Nevertheless, this process is not satisfactory either since two steps of treatment with potassium permanganate are present which have to be coordinated very precisely. In addition, this again involves an increased space demand, and when horizontal flow plants are employed, two very expensive plant parts are necessary since the use of stainless steel as the material to be processed is indispensible.

From WO 91/08324, processes for the metalization of nonconductors by the oxidation of five-membered heterocycles are known. It is mentioned therein that, in principle, other five-membered heterocycles may also be used instead of pyrrole; cf. page 4, paragraph 3. However, all Examples exclusively use pyrrole.

From EP 0 339 340, novel polythiophenes and their use are known, including 3,4-ethylenedioxythiophene. These substances are to be used mainly for the antistatic finishing of substrates which do not or but poorly conduct electric current.

It has been the object of the invention to develop a simplified and yet very reliable process for the production of through-connected printed circuit boards which requires only one permanganate step and yet leads to optimum results.

Surprisingly, it has now been found that an extremely simple combined procedure according to DE-A-40 40 226 is possible if ethylene-3,4-dioxythiophene is employed as the monomeric starting compound, the acid of the fixation step is quite precisely matched to the monomer system, and a very special rinsing sequence is employed as an aftertreatment following the permanganate treatment step.

Thus, this process can be described as follows:
1) swelling in a per se known treatment liquid and rinsing with water;
2) treatment with alkaline permanganate solution (desmearing);
3) rinsing with water;
4) rinsing with acidic aqueous solution (pH value about 1, rinsing time 10 to 120 s, depending on acid content);

5) rinsing with water;
6) rinsing with alkaline aqueous solution (pH 8 to 9.5);
7) rinsing with water;
8) rinsing with microemulsion of ethylene-3,4-dioxythiophene (catalyst);
9) rinsing with acid (fixation);
10) rinsing with water;
11) coppering;
12) rinsing with water; and
13) drying;
14) usual process steps for creating the printed circuit pattern.

With this process, it is possible to produce high-grade multi-layer circuits of perfect quality with a quite short procedure.

This surprising solution to the problem is probably due to the fact that the manganese dioxide which has been formed on the hole walls after the permanganate treatment is changed on the surface by the treatment with an acid solution (step 4) in such a way that the later formation of a polymer film becomes more readily controlled and can be realized under a very wide range of process conditions. One possible explanation is that the deposited manganese dioxide may comprise an undefinable amount of hydroxidium. This could possibly delay the polymerization step in the initial phase. To avoid premature polymerization of the manganese dioxide which is now weakly acidic at its surface, rinsing is again performed, and neutralization is effected with a very weakly alkaline solution (step 6). Only by using this rinsing sequence, practical results can be achieved which are reproducibly good.

It has further been shown that the monomer solution based on pyrrole and solvent which has been preferably used to date will not lead to useful and reproducible results, even with the rinsing sequence described.

Perfect results can only be achieved by using an aqueous-based microemulsion of ethylene-3,4-dioxythiophene in combination with the previously mentioned rinsing system and a matched fixing solution. It is quite remarkable that the lateral growth of copper on the polypyrrole film which is considered for comparison is considerably slower than that on the polyethylenedioxythiophene film as employed according to the invention. In a rough approximation, it may be said that the copper deposition on the polythiophene film is about ten times as fast as that on the polypyrrole film when the same copper electrolytes are used (Applicant's CUPROSTAR LP-1). As might be expected, this results in a considerably quicker completion of the coppering of the bore hole walls and thus in a quality bonus.

As the acid in the subsequent fixation, polystyrenesulfonic acid is preferably used, but good results may also be achieved with other acids, e.g., $H_2SO_4$, naphthalene-1,5-disulfonic acid, dodecylbenzenesulfonic acid, polyphosphoric acid and polystyrenesulfonic acid, optionally with the addition of 3,4-ethylenedioxythiophene.

The process described can be used both in conventional immersion plants and in horizontal flow plants.

Optionally, the steps of catalyzing (8) and fixing (9) may also be combined into one single step.

EXAMPLE 1

In all Examples, a glass fiber reinforced epoxy resin base material (FR-4) was used. The material was in a bored and deburred condition.

1 The substrates were subjected to a conventional bore hole cleaning procedure.

| | | | |
|---|---|---|---|
| a) | swelling (Condisolve ML) | 8 min | 60° C. |
| b) | rinsing | | |
| c) | alkaline permanganate (Permaprep MSH) | 8 min | 70° C. |
| d) | rinsing | | |
| e) | neutralizing (Remover Mn) | 1 min | 20–30° C. |
| f) | rinsing | | |
| g) | drying | | |

The materials thus desmeared were further processed (through-connected) in standard direct metalization processes based on conductive polymers.

1.1 Direct metalization process "DMS-2" (pyrrole base)

| | | | |
|---|---|---|---|
| a) | initial etching (BLACID DMA) | 1 min | 30° C. |
| b) | rinsing | | |
| c) | conditioning (BLASOLIT DMS ⅔) | 2 min | 45° C. |
| d) | rinsing | | |
| e) | potassium permanganate (pH 9.5) (aqueous solution) | 2 min | 92° C. |
| f) | rinsing | | |
| g) | catalyzing (catalyst DMS 2) (pyrrole base) | 1 min | 20–25° C. |
| h) | fixation (sulfuric acid 180 g/l) | 1 min | 20–25° C. |
| i) | rinsing | | |
| j) | coppering (CUPROSTAR LP-1) | ca. 60 min, | $I = 2 \text{ A/dm}^2$ |
| k) | rinsing | | |
| l) | drying | | |

The printed circuit boards were coppered to about 25 to 30 μm. One board was removed after 3 min for performing a transmitted light test (for the result, see Table).

The completely coppered boards were immersed in a solder bath at 288° C. for 10 s in order to simulate the conditions of the soldering process (thermal stress). Then, a ground cross-section was made, and the Cu/Cu deposition on the inner layer and the complete covering of the bore hole walls was evaluated (for the results, see Table).

1.2 Direct metalization process "DMS-E" (3,4-ethylenedioxythiophene base)

| | | | |
|---|---|---|---|
| a) | initial etching (BLACID DMA) | 1 min | 30° C. |
| b) | rinsing | | |
| c) | conditioning (BLASOLIT V) | 2 min | 45° C. |
| d) | rinsing | | |
| e) | potassium permanganate (pH 9.5) (aqueous solution) | 2 min | 80° C. |
| f) | rinsing | | |
| g) | catalyzing (catalyst DMS E) (thiophene base, about 1%) | 1 min | 20–30° C. |
| h) | fixation (e.g., polystyrenesulfonic acid, 2.5%) | 1 min | 20–30° C. |
| i) | rinsing | | |
| j) | coppering (CUPROSTAR LP-1) | ca. 60 min, | $I = 2 \text{ A/dm}^2$ |
| k) | rinsing | | |
| l) | drying | | |

The processing and evaluation was the same as in 1.1.

2 The substrates were subjected to a combined desmearing and direct metalization process.

| | | | |
|---|---|---|---|
| a) | swelling (Condisolve ML) | 5 min | 60° C. |
| b) | rinsing | | |
| c) | potassium permanganate, alkaline | 5 min | 85° C. |

After these two steps, the boards were diversified and directly further processed following different procedures.

2.1 d) rinsing
e) steps g) to l) according to Example 1.1
2.2 d) rinsing
e) steps g) to l) according to Example 1.1, but using a 2.5% aqueous solution of polystyrenesulfonic acid in the fixation [step 1.1, h)].
2.3 d) rinsing e) steps g) to l) according to Example 1.2
2.4 d) rinsing
e) steps g) to l) according to Example 1.2, but using $H_2SO_4$, 250 g/l, instead of polystyrenesulfonic acid in the fixation [step h)].
2.5 d) rinsing
e) acid rinsing (about pH 1, adjusted with $H_2SO_4$)
f) rinsing
g) alkaline rinsing (pH 8 to 9.5, adjusted with NaOH)
h) rinsing The boards were again diversified and further processed in different ways:
2.5.1 i) step e) according to Example 2.1
2.5.2 i) step e) according to Example 2.2
2.5.3 i) step e) according to Example 2.3
2.5.4 i) step e) according to Example 2.4

The further processing was performed as described under 1.1.

Results

| Examples | transmitted light test after 3 min of coppering at 2 A/dm² | evaluation of ground cross-section | | |
|---|---|---|---|---|
| | | voids | ring voids | Cu/Cu binding |
| 1.1 | $d_0$–$d_1$ | — | — | o.k. |
| 1.2 | $d_0$ | — | — | o.k. |
| 2.1 | $d_3$ | 0–5% | — | o.k. |
| 2.2 | $d_3$ | 0–5% | — | 50% o.k. |
| 2.3 | 60% not covered | — | — | o.k. |
| 2.4 | 70% not covered | — | 20% | not evaluated |
| 2.5.1 | $d_2$ | — | — | o.k. |
| 2.5.2 | 50% not covered | — | 0–5% | o.k. |
| 2.5.3 | $d_0$ | — | — | o.k. |
| 2.5.4 | $d_0$–$d_1$ | — | — | o.k. |

In the transmitted light test, $d_0$ means a complete, defectless covering. Evaluations $d_1$ to $d_5$ represent increasingly worse and more incomplete copper coverings. The specimens are sawed from the circuit is such a way that the bore hole is cut in halves in the vertical direction whereby the through-connecting area becomes visible. Then, the sample is illuminated from the bottom and observed through a microscope.

The evaluation of the Examples clearly shows that perfect results can only be achieved with the procedure according to the invention. If the same experiments are performed in a horizontal flow plant, similar results are obtained.

Comparably good results are obtained if step h) is performed with
naphthalene-1,5-disulfonic acid 80 g/l
dodecylbenzenesulfonic acid 120 g/l
polystyrenesulfonic acid 40 g/l
+3,4-ethylenedioxythiophene 0.15 g/l

EXAMPLE 2

Bored and deburred substrates are treated as follows:

| a) | swelling (Condisolve ML) | 5 min | 60° C. |
|---|---|---|---|
| b) | rinsing | | |

-continued

| c) | alkaline permanganate | 5 min | 85° C. |
|---|---|---|---|
| d) | rinsing | | |
| e) | acid rinsing (about pH 1) | | |
| f) | rinsing | | |
| g) | alkaline rinsing (about pH 8 to 9.5) | | |
| h) | rinsing | | |
| i) | catalyzing, aqueous solution of about 0.1% 3,4-ethylenedioxythiophene and about 0.33% polystyrenesulfonic acid | 1 min | 20–30° C. |
| j) | rinsing | | |
| k) | coppering | | |
| l) | rinsing | | |
| m) | drying | | |

Evaluation
Transmitted light test: $d_0$ to $d_1$
ground cross-section no objections
Comparably good results are obtained if step i) is performed with

| naphthalene-1,5-disulfonic acid | 8 g/l |
|---|---|
| +3,4-ethylenedioxythiophene | 0.2 g/l |
| polyphosphoric acid | 20 g/l |
| +3,4-ethylenedioxythiophene | 1 g/l |

Preferred process condition for the process according to the invention

| swelling: | 1 to 10 min | 40–70° C. |
|---|---|---|
| potassium permanganate: | 1 to 10 min | 70–95° C. |
| | $KMnO_4$ | 40–100 g/l |
| | NaOH or KOH | 10–60 g/l |
| acid rinsing: | 0.1–200 g/l $H_2SO_4$ | 10–120 s |
| alkaline rinsing: | pH 8 to 9.5 | 10–120 s |
| catalyzing: | 3,4-ethylenedioxythiophene + emulsifier | 10 s–5 min |
| | | 0.1–10 g/l |
| fixation: | acid, preferably polystyrenesulfonic acid | 10 s–5 min |
| | | 0.5–100 g/l |
| | other acids | 5–200 g/l |

What is claimed is:
1. A process for producing through-connected printed circuit boards or multilayered printed circuit boards with a polymer base with conductive polymers using a combined desmearing and direct metalization process wherein the polymer base materials, provided with bore holes, are subjected to the following process steps:
a) swelling in a treatment liquid and rinsing with water;
b) treatment with alkaline permanganate solution to effect and forming a manganese dioxide layer;
c) rinsing with water;
d) rinsing with acidic aqueous solution to thereby exchange any hydroxidium formed in step b);
e) rinsing with water;
f) rinsing with alkaline aqueous solution to neutralize the manganese dioxide layer;
g) rinsing with water;
h) rinsing with microemulsion of ethylene-3,4-dioxythiophene catalyst;
i) rinsing with acid;
j) rinsing with water;
k) coppering;
l) rinsing with water; and
m) drying;
n) creating a printed circuit pattern.
2. A process according to claim 1, characterized in that the acid in step d is sulfuric acid in amounts of from 0.1 to 200 g/l.

3. A process according to claim 1, characterized in that the alkali in step f is aqueous sodium hydroxide.

4. A process according to claim 1, characterized in that the acid in step i is polystyrenesulfonic acid in amounts of from 0.5 to 100 g/l.

5. A process according to claim 1, characterized in that steps h and i are combined and performed with a mixture of ethylene-3,4-dioxythiophene and an acid.

* * * * *